(12) United States Patent
Chern et al.

(10) Patent No.: US 9,419,617 B2
(45) Date of Patent: *Aug. 16, 2016

(54) CIRCUIT FOR REDUCING NEGATIVE BIAS TEMPERATURE INSTABILITY

(71) Applicant: TAIWAN SEMICONDUCTOR MANUFACTURING COMPANY, LTD., Hsinchu (TW)

(72) Inventors: Chan-Hong Chern, Palo Alto, CA (US); Fu-Lung Hsueh, Cranbury, NJ (US); Ming-Chieh Huang, San Jose, CA (US); Bryan Sheffield, Austin, TX (US); Chih-Chang Lin, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/331,711

(22) Filed: Jul. 15, 2014

(65) Prior Publication Data

US 2014/0320169 A1 Oct. 30, 2014

Related U.S. Application Data

(63) Continuation of application No. 14/045,364, filed on Oct. 3, 2013, now Pat. No. 8,791,720, which is a continuation of application No. 12/768,899, filed on Apr. 28, 2010, now Pat. No. 8,570,068.

(51) Int. Cl.
*H03K 19/0175* (2006.01)
*H03K 19/0185* (2006.01)
(Continued)

(52) U.S. Cl.
CPC .......... *H03K 19/01855* (2013.01); *H03K 3/012* (2013.01); *H03K 3/35625* (2013.01); *H03K 3/356008* (2013.01); *H03K 19/0016* (2013.01); *H03K 19/0963* (2013.01)

(58) Field of Classification Search
CPC ................... H03K 19/0016; H03K 19/00315; H03K 17/102; H03K 19/01707; H03K 3/356113; H03K 3/35625; H03K 19/0013; H03K 19/0002; H03K 19/00361; H03K 19/01728; H03K 19/09425; H03K 19/0948; H03K 19/0963; H03K 3/356156; H03K 19/0826; H03K 19/09429; H03K 19/0175; H03K 19/017509; H03K 19/017518; H03K 19/017554; H03K 19/01806; H03K 19/018507; H03K 19/09418; H03K 19/09448; H03K 19/212; H03K 2005/00163; H03K 5/2436; G11C 2207/2227; G11C 7/12; G11C 7/20

See application file for complete search history.

(56) References Cited

U.S. PATENT DOCUMENTS 4,680,487 A 7/1987 Kobayashi
5,631,579 A 5/1997 Miki et al.
(Continued)

FOREIGN PATENT DOCUMENTS

CN 1945499 4/2007

OTHER PUBLICATIONS

Office Action from corresponding application No. CN 201110021189.9.

*Primary Examiner* — Vibol Tan
(74) *Attorney, Agent, or Firm* — Hauptman Ham, LLP

(57) ABSTRACT

A circuit comprises a control circuit having an output node. The circuit also comprises a half latch keeper circuit coupled to the control circuit. The half latch keeper circuit is configured to control the output node during a standby mode. The circuit also comprises a transistor coupled to the output node. The control circuit is configured to turn off the transistor during the standby mode.

20 Claims, 3 Drawing Sheets

(51) Int. Cl.
  *H03K 19/096* (2006.01)
  *H03K 3/012* (2006.01)
  *H03K 3/3562* (2006.01)
  *H03K 3/356* (2006.01)
  *H03K 19/00* (2006.01)

(56) References Cited

U.S. PATENT DOCUMENTS

| | | | |
|---|---|---|---|
| 6,151,266 A * | 11/2000 | Henkels | G06F 9/30141 365/230.05 |
| 6,310,499 B1 | 10/2001 | Radjassamy | |
| 6,433,586 B2 | 8/2002 | Ooishi | |
| 6,448,812 B1 | 9/2002 | Bacigalupo | |
| 6,489,808 B2 * | 12/2002 | Iizuka | 326/56 |
| 6,522,171 B2 | 2/2003 | Hanson et al. | |
| 6,809,546 B2 | 10/2004 | Song et al. | |
| 6,809,570 B2 | 10/2004 | Francom | |
| 7,046,036 B2 | 5/2006 | Chen et al. | |
| 7,058,827 B2 | 6/2006 | Rose et al. | |
| 7,183,808 B2 | 2/2007 | Lai | |
| 7,254,728 B2 | 8/2007 | Rose et al. | |
| 7,411,413 B2 * | 8/2008 | Shimazaki | G01R 31/318575 326/16 |
| 7,884,640 B2 | 2/2011 | Greene et al. | |
| 8,570,068 B2 | 10/2013 | Chern et al. | |
| 2004/0143769 A1 | 7/2004 | Deng et al. | |
| 2007/0176642 A1 | 8/2007 | Kursun et al. | |
| 2008/0258769 A1 | 10/2008 | Franger et al. | |

* cited by examiner

CIRCUIT FOR REDUCING NEGATIVE BIAS TEMPERATURE INSTABILITY

PRIORITY CLAIM

The present application is a continuation of U.S. application Ser. No. 14/045,364, filed Oct. 3, 2013, which is a continuation of U.S. application Ser. No. 12/768,899, filed Apr. 28, 2010, now U.S. Pat. No. 8,570,068, the disclosures of which are incorporated herein by reference in their entireties.

TECHNICAL FIELD

The present disclosure relates generally to an integrated circuit, more particularly a logic gate driver.

BACKGROUND

In advanced process technology, Negative Bias Temperature Instability (NBTI) effect is a significant degradation source of transistors' threshold voltage (Vt) and currents (Idsat/Idlin). NBTI manifests as an increase in the threshold voltage (Vt) and consequent decrease in drive currents (Idsat/Idlin). Due to the NBTI degradation on transistors' Vt and Idsat/Idlin, the affected transistor's speed is reduced and may cause significant timing issues, such as max delay paths and detrimental min-delay paths (i.e., delay mismatch between generating and sampling paths).

In particular, NBTI can happen when a PMOS transistor undergoes a constant stress, such as in a clock gating (e.g., not allowing a clock signal to pass through) or standby mode (i.e., not in active operation) situation in an effort to reduce chips' dynamic power consumption. For example, in some applications, a relatively large inverter driver and an output node are parked at a logical 1 state using an operational PMOS transistor during a clock gating or standby mode situation.

Conventional methods to deal with NBTI includes: 1) guard banding (i.e., taking out some initially available operation frequency, e.g., shipping a chip at 1 GHz when 1.2 GHz is initially available), 2) gate sizing, and 3) Vdd and Vt tuning, etc. However, the drawbacks for these methods include: 1) sacrificing chips' initially available performance by as much as 10-15% for guard banding, 2) an area overhead of 10-20% and the accompanying power consumption increase for gate sizing, and 3) aggravating NBTI degradation for Vdd/Vt tuning.

Accordingly, new circuits and methods are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable concepts that can be embodied in a wide variety of specific contexts. The specific embodiments discussed are merely illustrative of specific ways to make and use, and do not limit the scope of the disclosure.

Figure 1:
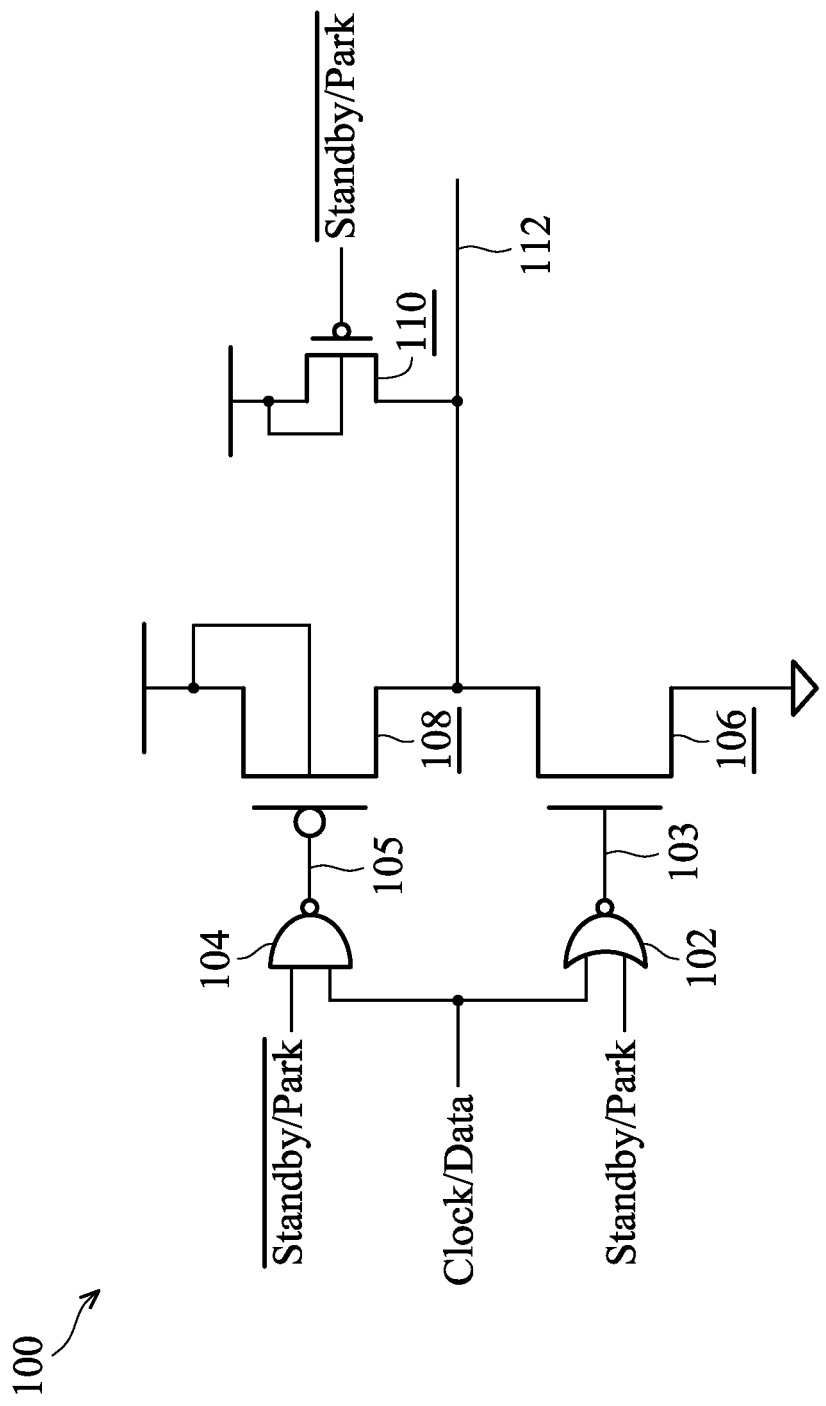
FIG. 1 is a schematic diagram showing an exemplary a circuit to eliminate NBTI damage in a logic gate driver according to some embodiments.

FIG. 1 is a schematic diagram showing an exemplary circuit to eliminate NBTI damage in a logic gate driver according to some embodiments. The circuit 100 is a logic gate (i.e., inverter with control logics) driver and has an output node 112 that is logically required to park at a logical 1 state in a clock gating (e.g., not allowing a clock signal to pass through) or standby mode (i.e., not in active operation) situation. In the description below, a "standby" mode refers to clock gating, standby situations, and/or other similar situations (e.g., sleep mode, etc.).

The circuit 100 includes a NOR gate 102 coupled to an NMOS transistor 106. A control circuit comprising, for example, a NAND gate 104, is coupled to an operational PMOS transistor 108. The control circuit is configured to turn off the operational PMOS transistor 108 during the standby mode. The operational PMOS transistor 108 and the NMOS transistor 106 are coupled to the output node 112. A PMOS transistor 110 is also coupled to the output node 112 and keeps the output node 112 at a logical 1 during the standby mode. A clock/data signal and a standby/park signal are coupled to the NOR gate 102. The clock/data signal and a complementary standby/park bar signal are coupled to the control circuit. The complementary standby/park bar signal is also coupled to the PMOS transistor 110.

When the standby/park signal is asserted (logical 1), the complementary standby/park bar signal (logical 0) coupled to the NAND gate 104 makes the NAND gate 104's inverted signal 105 a logical 1, which turns off the operational PMOS transistor 108. The standby/park bar signal (logical 0) is also coupled to the PMOS transistor 110, which is turned on to keep the output node 112 at a logical 1 (and charge up the output node 112 to a logical 1 as logically required). Further, the standby/park signal (logical 1) is coupled to the NOR gate 102, thus the NOR gate 102's output 103 is a logical 0, which turns off the NMOS transistor 106. The size of the NOR gate 102 can be relatively small (e.g. ½) compared to a NOR gate that is coupled to both the PMOS transistor and NMOS transistor in other conventional circuits. In summary, the operational PMOS transistor 108 is turned off and the output node 112 is kept at a logical 1 when the standby/park signal is asserted (logical 1).

When the standby/park signal is not asserted (logical 0), the complementary standby/park bar signal (logical 1) coupled to the NAND gate 104 makes the clock/data signal go through the NAND gate 104 as the inverted signal 105, which is coupled to the gate of the operational PMOS transistor 108. Also, because the standby/park signal coupled to the NOR gate 102 is a logical 0, the clock/data signal goes through the NOR gate 102 as an inverted signal 103, which is coupled to the NMOS transistor 106. If the clock/data signal is a logical 0, the inverted signal 105 (logical 1) turns off the operational PMOS transistor 108, and the inverted signal 103 (logical 1) turns on the NMOS transistor 106, to pull down the output node 112 to a logical 0. If the clock/data signal is a logical 1, the inverted signal 105 (logical 0) turns on the operational PMOS transistor 108, and the inverted signal 103 (logical 0) turns off the NMOS transistor 106, to pull up the output node 112 to a logical 1. In summary, the output node 112 follows the clock/data signal when the standby/park signal is not asserted (logical 0).

The circuit 100 is useful for a relatively large inverter driver and an output node logically required to park at a logical 1 state in a clock gating or standby mode situation. By turning off the operational PMOS transistor 108 during standby/park mode, the NBTI degradation on the operational PMOS transistor 108 can be eliminated. Even though a PMOS transistor (not shown) in the NAND gate 104 may be stressed during the standby mode, the PMOS transistor in the NAND gate 104 is not in the clock/data signal path so it is of no concern. The PMOS transistor in the NAND gate 104 can be referred to as a sacrificial PMOS transistor. Also, the PMOS transistor 110 that keeps the output node 112 at the logical 1 during a standby mode may be also stressed, but it is not in the clock/data signal path, either. The PMOS transistor 110 can be also referred to as a sacrificial PMOS transistor. The PMOS transistor 110 can be shared by a group of logic gates that use the same standby/park signal.

Figure 2:
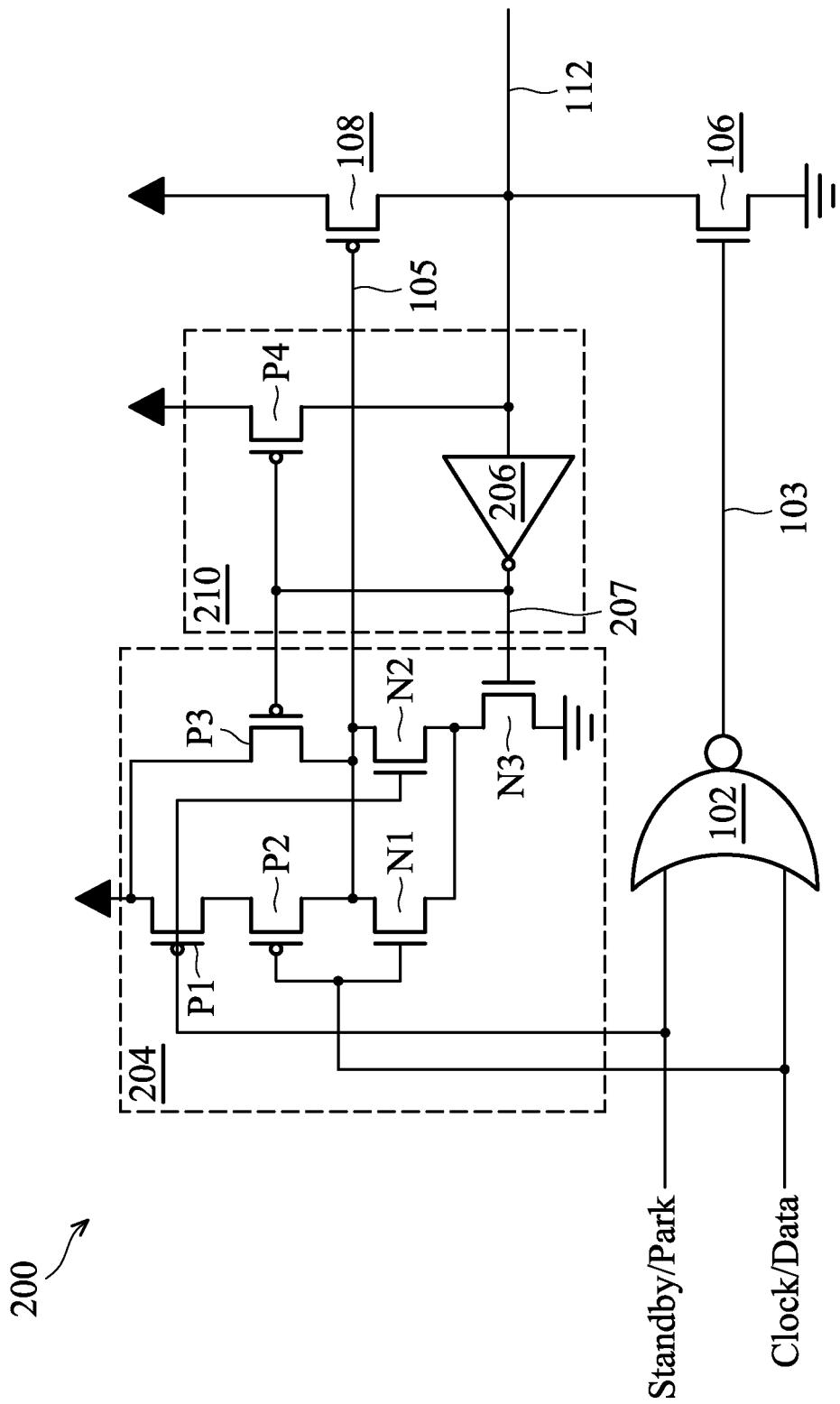
FIG. 2 is a schematic diagram showing another exemplary circuit to eliminate NBTI in a logic gate driver according to some embodiments.

FIG. 2 is a schematic diagram showing another exemplary circuit to eliminate NBTI impacts to a logic gate driver according to some embodiments. The circuit 200 is a logic gate (i.e., inverter with control logics) driver and has an output node 112 that is logically required to park at a logical 1 state during a standby mode. The circuit 200 includes a control circuit 204 and a half latch keeper circuit 210. In this embodiment, the control circuit 204 includes a NOR gate (comprising transistors P1, P2, N1, and N2), a PMOS transistor P3, and an NMOS transistor N3. The control circuit 204 is coupled to a half latch keeper circuit 210 (comprising a PMOS transistor P4 and an inverter 206). The control circuit 204 is also coupled to the operational PMOS transistor 108 and turns off the operational PMOS transistor 108 during the standby mode. A NOR gate 102 is coupled to an NMOS transistor 106 that is coupled to the output node 112. A clock/data signal and a standby/park signal are coupled to the NOR gate 102 and the control circuit 204.

The half latch keeper circuit 210 is coupled to the output node 112 and keeps the output node 112 at a logical 1 during the standby mode. The size of the NOR gate 102 and/or the NOR gate (comprising transistors P1, P2, N1, and N2) in the control circuit 204 can be relatively small (e.g. ½) compared to a NOR gate that is coupled to both the PMOS transistor and NMOS transistor in other conventional circuits.

When the standby/park signal is asserted (logical 1), the NOR gate 102's output 103 is a logical 0, which turns off the NMOS transistor 106. The standby/park signal (logical 1) turns on the NMOS transistor N2. If the output node 112 had a logical 0, the inverter 206 inverts the logical 0 to a logical 1 and turns on the NMOS transistor N3. In this case, the NMOS transistors N2 and N3 pull down the inverted signal 105 to turn on the operational PMOS transistor 108, which in turn pull up the output node 112 to a logical 1. After the output node 112 becomes a logical 1, the inverter 206 provides an inverted output 207 (logical 0) to the gate of the NMOS transistor N3 to turn off the NMOS transistor N3. The inverted output 207 (logical 0) also turns on a PMOS transistor P3 to pull up the inverted signal 105 to a logical 1, which turns off the operational PMOS transistor 108. A PMOS transistor P4 is also turned on and keeps the output node 112 at the logical 1.

If the output node 112 had a logical 1, the inverter 206 inverts the logical 1 to a logical 0 and turns off the NMOS transistor N3. The inverted output 207 (logical 0) also turns on PMOS transistors P3 and P4. The PMOS transistor P3 keeps the inverted signal 105 at logical 1 to turn off the operational PMOS transistor 108. Even though the PMOS transistor P3 may be stressed during the standby mode, the PMOS transistor P3 is not in the clock/data signal path. The PMOS transistor P3 can be referred to as a sacrificial PMOS transistor. The PMOS transistor P4 keeps the output node 112 at logical 1 during the standby mode. Even though the PMOS transistor P4 may be stressed during the standby mode, the PMOS transistor P4 is not in the clock/data signal path, either. The PMOS transistor P4 can be also referred to as a sacrificial PMOS transistor.

When the standby/park signal is not asserted (logical 0), the NOR gate 102's output 103 is an inverted signal of the clock/data signal. If the clock/data signal is a logical 1, the NOR gate 102's output 103 becomes a logical 0, which turns off the NMOS transistor 106 to keep the output node 112 at a logical 1. If the clock/data signal is a logical 0, the NOR gate 102's output 103 becomes a logical 0, which turns on the NMOS transistor 106 to pull down the output node 112 to a logical 0. The NMOS transistor 106 has larger drive strength than the PMOS transistor P4 in the half latch keeper circuit 210 to pull down the output node 112 to a logical 0. The inverter 206's output 207 becomes a logical 1 to turn on the NMOS transistor N3 and turn off the PMOS transistors P3 and P4. If the clock/data signal changes from a logical 0 to a logical 0, an NMOS transistor N1 is turned on and the inverted signal 105 is pulled down through the NMOS transistors N1 and N3 to a logical 0 to turn on the operational PMOS transistor 108, which pulls up the output node 112 to a logical 1. Therefore, the output node 112 follows the clock/data signal when the standby/park signal is not asserted.

The control circuit 204 and the sacrificial PMOS transistors P3 and P4 can be made relatively small compared to a very large inverter driver of a logic gate. Therefore, the circuit 200 does not add significant chip area overhead in some embodiments. The control circuit 204 and the sacrificial PMOS transistors P3 and P4 can be shared by a group of logic gates to further save chip area.

Figure 3:
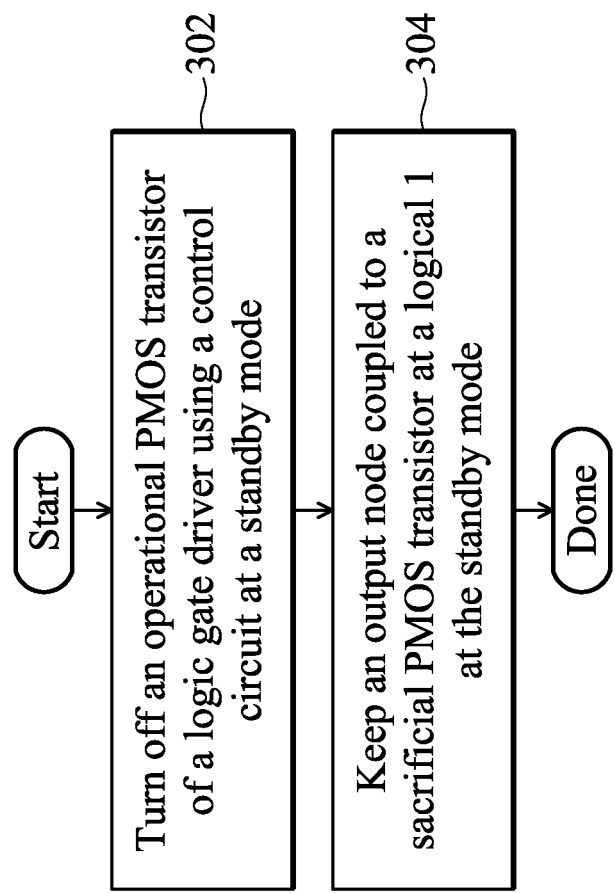
FIG. 3 is a flow diagram showing an exemplary method for the circuit shown in FIG. 1 and FIG. 2 according to some embodiments.

FIG. 3 is a flow diagram showing an exemplary method for the circuit shown in FIG. 1 and FIG. 2 according to some embodiments. At step 302, an operational PMOS transistor 108 of a logic gate driver is turned off using a control circuit, e.g., 104 or 204, at a standby mode. At step 304, an output node 112 coupled to a sacrificial PMOS transistor, e.g., 110 or P4, is kept at a logical 1 at the standby mode.

In some embodiments, a standby signal and/or a clock signal is supplied to the control circuit, e.g., 104 or 204. In some embodiments, a half latch keeper circuit, e.g., 210, keeps the output node 112 at logical 1 during the standby mode. In some embodiments, the control circuit, e.g., 204, includes a sacrificial PMOS transistor, e.g., P3.

An aspect of this description relates to a circuit comprising a control circuit having an output node. The circuit also comprises a half latch keeper circuit coupled to the control circuit. The half latch keeper circuit is configured to control the output node during a standby mode. The circuit also comprises a transistor coupled to the output node. The control circuit is configured to turn off the transistor during the standby mode.

Another aspect of this description relates to a method comprising processing a standby signal and a clock signal through a control circuit coupled to an output node. The method also comprises turning off a transistor coupled to the output node by the control circuit during a standby mode. The method further comprises controlling the output node with a half latch keeper circuit coupled to the control circuit.

A further aspect of this description related to a method comprising processing a standby signal and a clock signal through a control circuit coupled to an output node. The method also comprises turning off a transistor coupled to the output node by the control circuit during a standby mode. The method further comprises controlling the output node during the standby mode by a half latch keeper circuit coupled to the control circuit.

A skilled person in the art will appreciate that there can be many embodiment variations of this disclosure. Although embodiments and their features have been described in detail, it should be understood that various changes, substitutions and alterations can be made herein without departing from the spirit and scope of the embodiments as defined by the appended claims. For example, the same technique and circuit implementation described above can be applied to and shared by different types of logic gates, such as NAND and NOR gates. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiment of the disclosure.

What is claimed is:

1. A circuit comprising:
    a control circuit configured to receive a first signal and a second signal;
    a logic gate configured to receive the first signal and the second signal;
    an output node;
    a half latch keeper circuit coupled to the control circuit, the half latch keeper circuit being configured to control the output node during a standby mode;
    a first transistor coupled to the output node; and
    a second transistor coupled to the output node,
    wherein, responsive to the first signal,
        the control circuit is configured to turn off the first transistor during the standby mode, and
        the logic gate is configured to turn off the second transistor during the standby mode.

2. The circuit of claim 1, wherein the control circuit comprises a first PMOS transistor outside a clock signal path and the PMOS transistor is configured to turn off the first transistor coupled to the output node during the standby mode.

3. The circuit of claim 1, wherein
    the first signal is a standby signal output by a standby signal source;
    the second signal is a clock signal output by a clock signal source; and
    the control circuit is coupled to the standby signal source and to the clock signal source.

4. The circuit of claim 3, wherein the standby mode is based on the standby signal output by the standby signal source being at a logical 1, or the standby signal being at a logical 0 and a clock signal output by the clock signal source being at the logical 1.

5. The circuit of claim 3, wherein the control circuit comprises:
    a first PMOS transistor configured to turn off the first transistor coupled to the output node during the standby mode;
    a first NMOS transistor; and
    a first NOR gate, and the circuit further comprises:
    a second NMOS transistor as the second transistor coupled to the output node; and
    a second NOR gate as the logic gate, the second NOR gate being coupled to a gate of the second NMOS transistor, to the standby signal source, and to the clock signal source.

6. The circuit of claim 5, wherein the control circuit further comprises:
    a second PMOS transistor;
    a third PMOS transistor;
    a third NMOS transistor; and
    a fourth NMOS transistor,
    wherein the second PMOS transistor, the third PMOS transistor, the third NMOS transistor and the fourth NMOS transistor are together configured to be the first NOR gate.

7. The circuit of claim 6, wherein the half latch keeper circuit comprises:
    a fourth PMOS transistor; and
    an inverter,
    wherein the inverter is coupled to a gate of the fourth PMOS transistor, to a gate of the first PMOS transistor, and to a gate of the first NMOS transistor.

8. The circuit of claim 7, wherein the fourth PMOS transistor is outside a clock signal path and the fourth PMOS transistor is configured to keep the output node at a logical 1 during the standby mode.

9. The circuit of claim 7, wherein the first PMOS transistor and the fourth PMOS transistor are sacrificial PMOS transistors configured to be shared by a group of logic gates on a same chip.

10. The circuit of claim 7, wherein the second NMOS transistor has a drive strength greater than a drive strength of the fourth PMOS transistor and the second NMOS transistor is configured to pull down the output node to a logical 0 outside of the standby mode.

11. The circuit of claim 1, wherein the control circuit is configured to be shared by a group of logic gates on a same chip.

12. A method comprising:
    processing a standby signal and a clock signal through a control circuit coupled to an output node;
    turning off a transistor coupled to the output node by the control circuit during a standby mode;
    processing the standby signal and the clock signal through a NOR gate;
    turning off an NMOS transistor coupled to the NOR gate and to the output node during the standby mode; and
    controlling the output node with a half latch keeper circuit coupled to the control circuit.

13. The method of claim 12, the method further comprising:
    turning off the transistor coupled to the output node by a first PMOS transistor of the control circuit during the standby mode.

14. The method of claim 13, the method further comprising:
    turning off the NMOS transistor coupled to the NOR gate and to the output node outside of the standby mode; and pulling down the output node to a logical 0 outside of the standby mode.

15. The method of 12, wherein the standby mode is determined based on one or more of the standby signal being at a logical 1, or the standby signal being at a logical 0 and the clock signal being at the logical 1.

16. A method comprising:
processing a standby signal and a clock signal through a control circuit coupled to an output node;
turning off a transistor coupled to the output node by the control circuit during a standby mode;
processing the standby signal and the clock signal through a NOR gate;
controlling the output node outside of the standby mode with an NMOS transistor coupled to the NOR gate and to the output node; and
controlling the output node during the standby mode by a half latch keeper circuit coupled to the control circuit.

17. The method of claim 16, further comprising:
determining the output node is at a logical 0 in the standby mode and inverting the logical 0 of the output node to a logical 1;
turning on an NMOS transistor of the control circuit;
turning on the transistor coupled to the output node by the control circuit; and
pulling up the output node to the logical 1 in the standby mode.

18. The method of claim 17, further comprising:
inverting the logical 1 of the output node to the logical 0 based on a determination that the output node is changed from the logical 0 to the logical 1;
turning off the NMOS transistor of the control circuit; and
turning off the transistor coupled to the output node by the control circuit.

19. The method of claim 16, wherein the standby mode occurs if the standby signal is at a logical 1, or the standby signal is at a logical 0 and the clock signal is at the logical 1.

20. The method of claim 12, wherein turning off the transistor coupled to the output node by the control circuit during the standby mode comprises turning off the transistor coupled to the output node with a PMOS transistor of the control circuit.

* * * * *